(12) United States Patent
Kato

(10) Patent No.: US 9,336,994 B2
(45) Date of Patent: *May 10, 2016

(54) MULTI CHARGED PARTICLE BEAM WRITING APPARATUS AND MULTI CHARGED PARTICLE BEAM WRITING METHOD

(71) Applicant: NuFlare Technology, Inc., Yokohama (JP)

(72) Inventor: Yasuo Kato, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 26 days.

This patent is subject to a terminal disclaimer.

(21) Appl. No.: 14/662,612

(22) Filed: Mar. 19, 2015

(65) Prior Publication Data
US 2015/0194289 A1    Jul. 9, 2015

Related U.S. Application Data

(63) Continuation of application No. 13/370,835, filed on Feb. 10, 2012.

(30) Foreign Application Priority Data

Feb. 18, 2011 (JP) .................. 2011-033303

(51) Int. Cl.
*H01J 37/00* (2006.01)
*H01J 37/317* (2006.01)
(Continued)

(52) U.S. Cl.
CPC ............ *H01J 37/3174* (2013.01); *B82Y 10/00* (2013.01); *B82Y 40/00* (2013.01); *G03F 1/78* (2013.01);
(Continued)

(58) Field of Classification Search
USPC ..................................... 250/492.1
See application file for complete search history.

(56) References Cited

U.S. PATENT DOCUMENTS 4,259,724 A * 3/1981 Sugiyama ................. G06T 1/00
250/492.3
5,337,247 A * 8/1994 Hamaguchi ......... H01J 37/3026
250/491.1
(Continued)

FOREIGN PATENT DOCUMENTS

JP 5-267139 10/1993
JP 8-306608 11/1996
(Continued)

OTHER PUBLICATIONS

Japanese Office Action issued Aug. 12, 2014, in Japan Patent Application No. 2011-033303 (with English-language Translation).
(Continued)

*Primary Examiner* — Phillip A Johnston
(74) *Attorney, Agent, or Firm* — Oblon, McClelland, Maier & Neustadt, L.L.P.

(57) ABSTRACT

A charged particle beam writing apparatus includes a storage unit to store each pattern data of plural figure patterns arranged in each of plural small regions made by virtually dividing a writing region of a target workpiece to be written on which resist being coated. The charged particle beam writing apparatus further including an assignment unit to assign each pattern data of each figure pattern to be arranged in each of the plural small regions concerned, and a writing unit to write, for each of plural groups, each figure pattern in each of the plural small regions concerned by using a charged particle beam.

13 Claims, 12 Drawing Sheets

(51) Int. Cl.
   *G03F 1/78* (2012.01)
   *H01J 37/302* (2006.01)
   *B82Y 10/00* (2011.01)
   *B82Y 40/00* (2011.01)

(52) U.S. Cl.
   CPC ... *H01J 37/3026* (2013.01); *H01J 2237/31764* (2013.01); *H01J 2237/31771* (2013.01); *H01J 2237/31776* (2013.01); *H01J 2237/31796* (2013.01)

(56) References Cited

U.S. PATENT DOCUMENTS

| | | | |
|---|---|---|---|
| 5,382,498 | A | 1/1995 | Berger |
| 5,812,412 | A | 9/1998 | Moriizumi et al. |
| 6,285,783 | B1 | 9/2001 | Isomura et al. |
| 6,420,717 | B1 | 7/2002 | Babin et al. |
| 7,259,829 | B2 * | 8/2007 | Bleeker et al. ............. 355/67 |
| 7,495,243 | B2 * | 2/2009 | Kamikubo ............ B82Y 10/00 250/306 |
| 7,698,682 | B2 | 4/2010 | Anpo et al. |
| 7,824,828 | B2 * | 11/2010 | Fujimura ............ H01J 37/3174 250/492.2 |
| 8,257,888 | B2 * | 9/2012 | Sczyrba et al. ............... 430/30 |
| 2002/0148978 | A1 | 10/2002 | Innes et al. |
| 2007/0053242 | A1 | 3/2007 | Kasahara et al. |
| 2009/0001293 | A1 | 1/2009 | Sunaoshi |
| 2010/0072390 | A1 | 3/2010 | Yashima |
| 2011/0046762 | A1 | 2/2011 | Yashima |
| 2011/0066271 | A1 | 3/2011 | Anpo |

FOREIGN PATENT DOCUMENTS

| | | |
|---|---|---|
| JP | 2007-157742 | 6/2007 |
| JP | 2008-117871 | 5/2008 |
| JP | 2010-73918 | 4/2010 |
| JP | 2011-35298 | 2/2011 |

OTHER PUBLICATIONS

Office Action issued Sep. 29, 2014 in Taiwanese Patent Application No. 101103419 (with English-language Translation).

Office Action issued Feb. 3, 2015, in Japanese Patent Application No. 2011-033303 (with English-language Translation).

* cited by examiner

| Figure Code | Size | Position | Attribute Information··· |
|---|---|---|---|

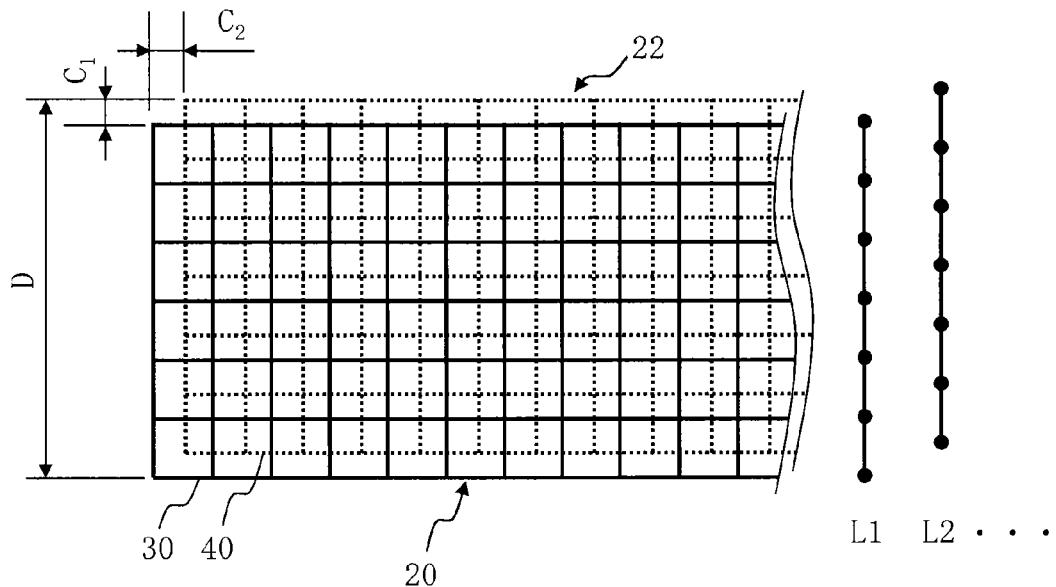
FIG. 5
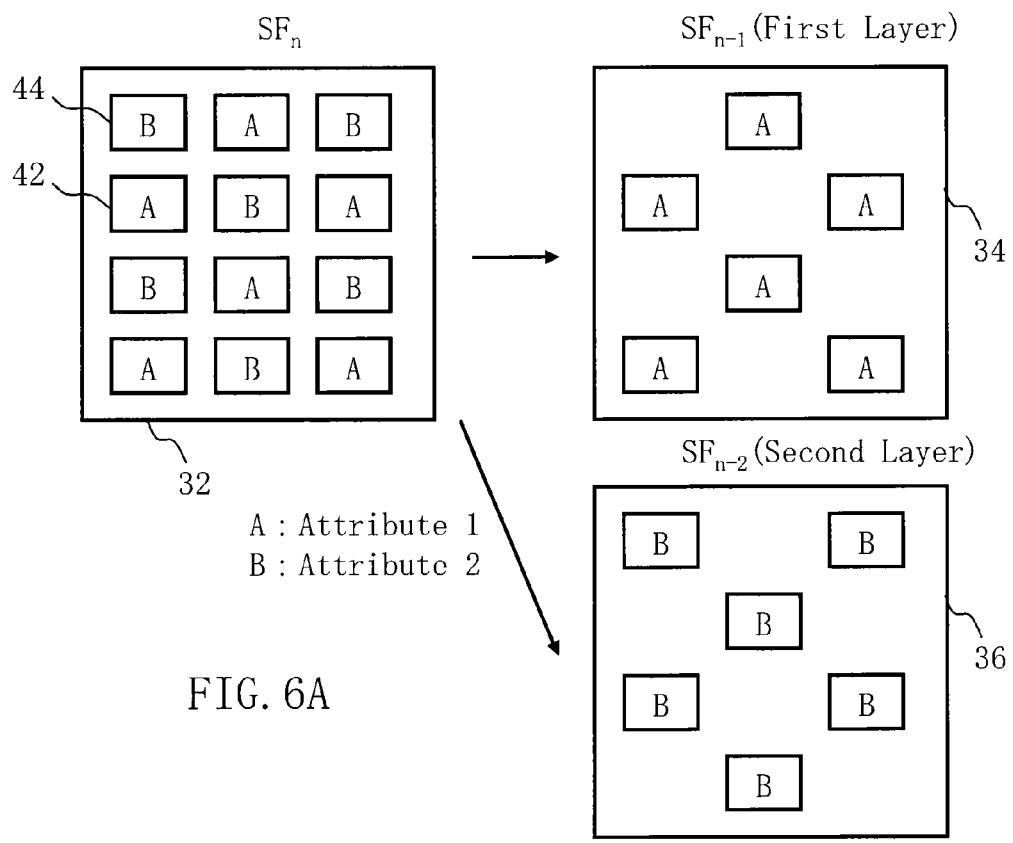
FIG. 6A
FIG. 6B

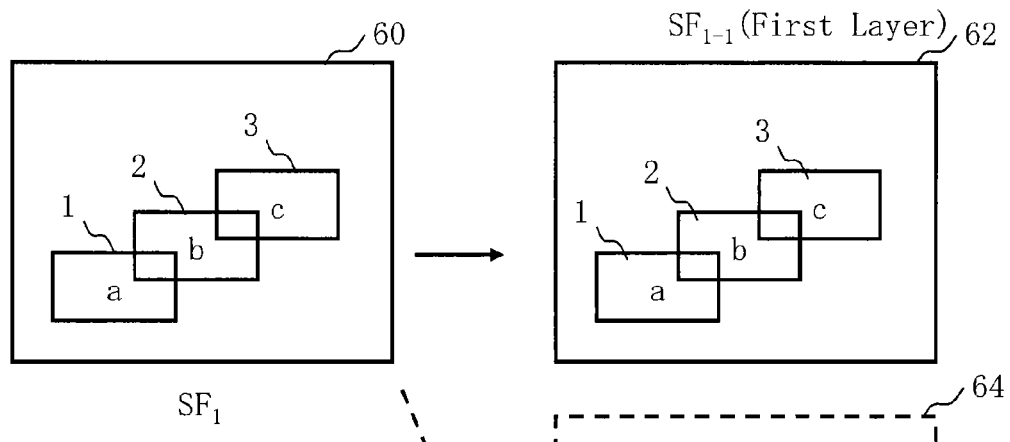
FIG. 9A
FIG. 9B
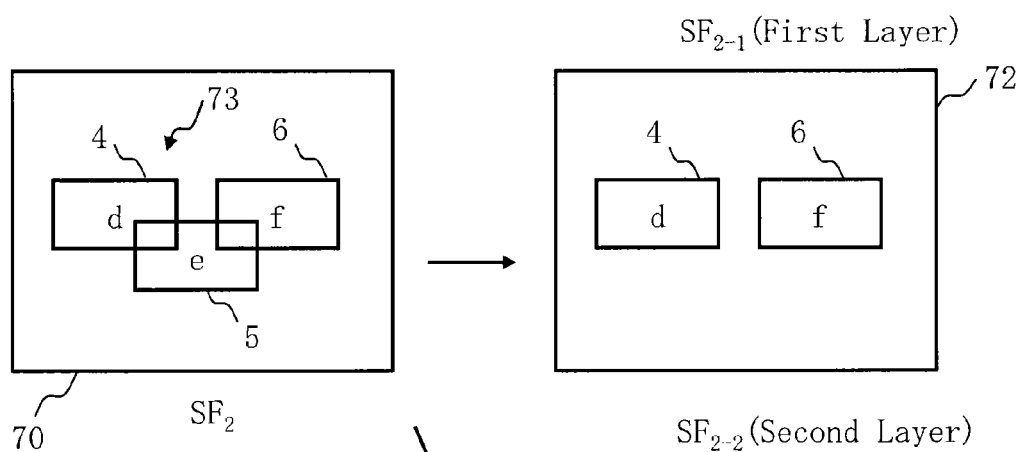
FIG. 10A
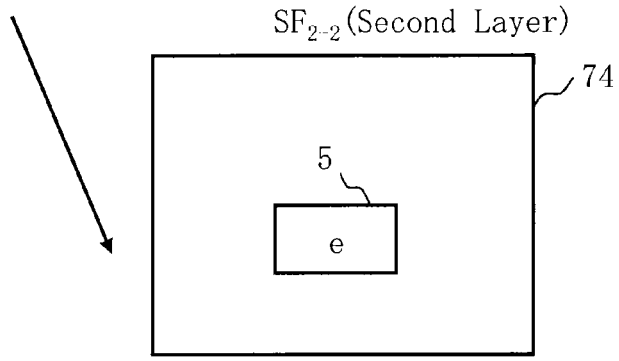
FIG. 10B

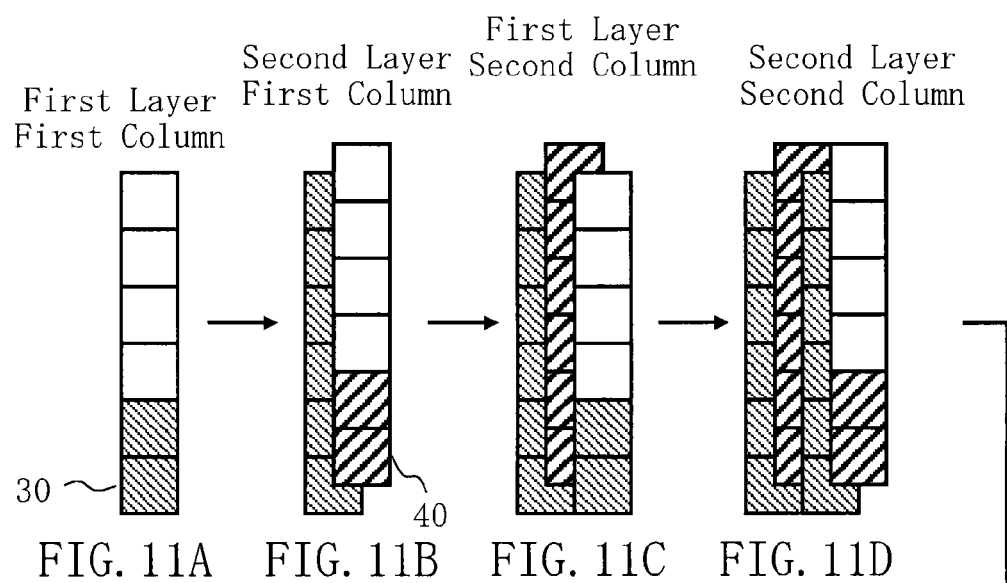
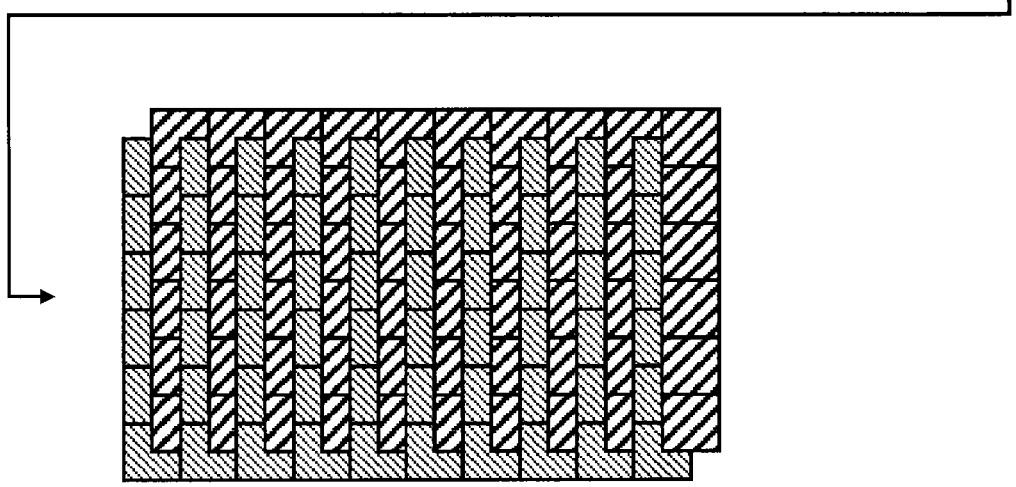
FIG. 11A  FIG. 11B  FIG. 11C  FIG. 11D
FIG. 11E

Related Art

MULTI CHARGED PARTICLE BEAM WRITING APPARATUS AND MULTI CHARGED PARTICLE BEAM WRITING METHOD

CROSS-REFERENCE TO RELATED APPLICATION

This application is a continuation of U.S. application Ser. No. 13/370,835 filed Feb. 10, 2012 and claims the benefit of priority from the prior Japanese Patent Application No. 2011-033303 filed on Feb. 18, 2011 in Japan, the entire contents of both of which are incorporated herein by reference.

BACKGROUND OF THE INVENTION

1. Field of the Invention

The present invention relates to a charged particle beam writing apparatus and a charged particle beam writing method. For example, the present invention relates to a writing method and apparatus that suppresses resist heating.

2. Description of Related Art

The microlithography technique which advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. In order to form a desired circuit pattern on semiconductor devices, a master or "original" pattern (also called a mask or a reticle) of high precision is needed. Thus, the electron beam writing technique, which intrinsically has excellent resolution, is used for producing such a highly precise master pattern.

FIG. 17 is a schematic diagram explaining operations of a variable-shaped electron beam (EB) writing apparatus. As shown in the figure, the variable-shaped electron beam writing apparatus operates as described below. A first aperture plate 410 has a quadrangular opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through a part of the variable-shape opening 421 of the second aperture plate 420, and thereby to irradiate a target workpiece or "sample" 340 placed on a stage which continuously moves in one predetermined direction (e.g. X direction) during the writing. In other words, a quadrangular shape that can pass through both the opening 411 and the variable-shape opening 421 is used for pattern writing in a writing region of the target workpiece 340 on the stage continuously moving in the X direction. This method of forming a given shape by letting beams pass through both the opening 411 of the first aperture plate 410 and the variable-shape opening 421 of the second aperture plate 420 is referred to as a variable shaped beam (VSB) method.

When performing the electron beam writing, the layout where a plurality of figures are densely arranged or figures are arranged to be overlapped with each other may be written. The case of slash patterns etc. can be cited as an example of the layout where figures are arranged to be overlapped with each other. By performing overlapping of figures, the number of shots can be reduced and the writing time can be shortened. When writing such layout figures as they are without any change, the dose density of the electron beam may be high. Therefore, there occurs a problem of being greatly affected by resist heating compared with a case of writing layout figures with sparse density. Thus, there is a problem that dimension etc. of a figure pattern written with such a high density may be varied.

As a method of reducing resist heating, for example, generally adopted is a multiple writing method of performing writing of patterns while overlapping them a plurality of times. As the multiple writing method, there are proposed a method of writing all the internal figure patterns a plurality of times by repeating the first writing and the second writing per unit of stripe region which is made by virtually dividing a chip region, and a method of writing all the internal figure patterns a plurality of times by alternately repeating the first writing and the second writing per unit of subfield in the stripe region (refer to, e.g., Japanese Patent Application Laid-open No. 2008-117871).

According to the multiple writing described above, a required dose is obtained by making one dose small for each figure and overlappingly writing the same figure a plurality of times. Further, it is also requested to overcome the problem by other method.

BRIEF SUMMARY OF THE INVENTION

In accordance with one aspect of the present invention, a charged particle beam writing apparatus includes a storage unit configured to store each pattern data of a plurality of figure patterns arranged in each of a plurality of small regions made by virtually dividing a writing region of a target workpiece to be written on which resist has been coated, wherein the each pattern data includes an assignment identifier, defined for each of the plurality of figure patterns, for assigning the each of the plurality of figure patterns concerned to one of a plurality of groups, to which one of the plurality of figure patterns concerned belongs, in one of the plurality of small regions, an assignment unit configured to assign the each pattern data of each figure pattern to be arranged in the each of the plurality of small regions concerned such that writing order is sorted per group of the plurality of groups, and a writing unit configured to write, for each of the plurality of groups, the each figure pattern in the each of the plurality of small regions concerned by using a charged particle beam.

In accordance with another aspect of the present invention, a charged particle beam writing method includes storing, in a storage device, each pattern data of a plurality of figure patterns arranged in each of a plurality of small regions made by virtually dividing a writing region of a target workpiece to be written on which resist has been coated, wherein the each pattern data includes an assignment identifier, defined for each of the plurality of figure patterns, for assigning the each of the plurality of figure patterns concerned to one of a plurality of groups, to which one of the plurality of figure patterns concerned belongs, in one of the plurality of small regions, reading the each pattern data from the storage device, and assigning the each pattern data of each figure pattern to be arranged in the each of the plurality of small regions concerned such that writing order is sorted per group of the plurality of groups, and writing, for each of the plurality of groups, the each figure pattern in the each of the plurality of small regions concerned by using a charged particle beam.

BRIEF DESCRIPTION OF THE DRAWINGS

FIG. 5 is a schematic diagram explaining an SF layer according to Embodiment 1;

FIGS. 6A and 6B show an example of assigning a plurality of figure patterns in an SF to a plurality of SF layers by using attribute information according to Embodiment 1;

FIGS. 9A and 9B show an assignment state when changing a precision parameter by using attribute information according to Embodiment 1 shown in FIGS. 7A and 7B;

FIGS. 10A and 10B show an assignment state when changing a precision parameter by using attribute information according to Embodiment 1 shown in FIGS. 8A and 8B;

FIGS. 11A to 11E show an example of a writing order according to Embodiment 1;

DETAILED DESCRIPTION OF THE INVENTION

In the following Embodiments, there will be described a structure in which an electron beam is used as an example of a charged particle beam. However, the charged particle beam is not limited to the electron beam, and other charged particle beam, such as an ion beam, may also be used. Moreover, a variable-shaped electron beam writing apparatus will be described as an example of a charged particle beam apparatus.

In the following Embodiments, there will be described a writing apparatus and a writing method that reduce effects due to resist heating.

Embodiment 1

Figure 1:
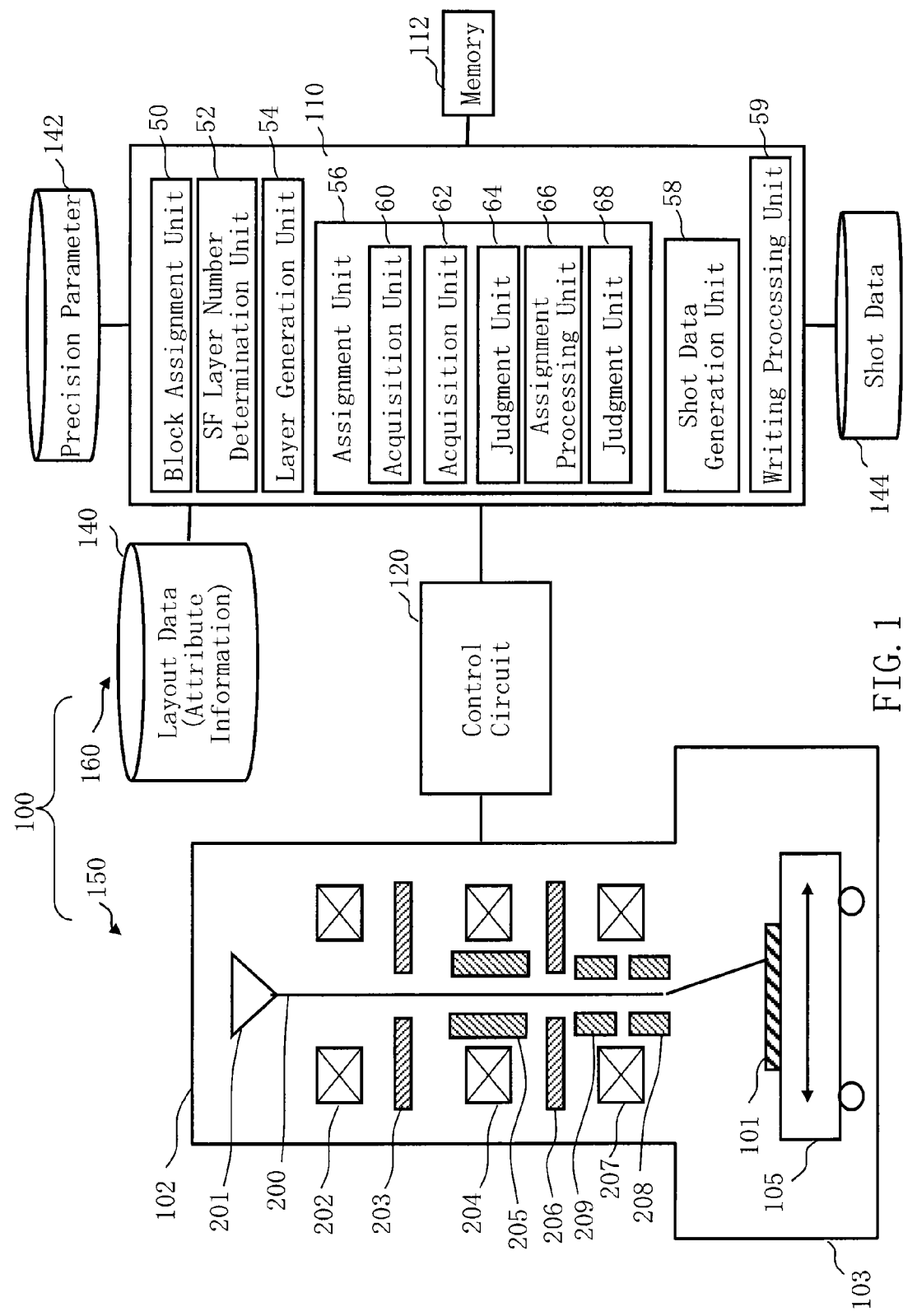
FIG. 1 is a schematic diagram showing a structure of a writing apparatus according to Embodiment 1.

FIG. 1 is a schematic diagram showing a structure of a writing or "drawing" apparatus according to Embodiment 1. In FIG. 1, a writing apparatus 100 includes a writing unit 150 and a control unit 160. The writing apparatus 100 is an example of a charged particle beam writing apparatus, and especially, an example of a variable-shaped beam writing apparatus. The writing unit 150 includes an electron lens barrel 102 and a writing chamber 103. In the electron lens barrel 102, there are arranged an electron gun assembly 201, an illumination lens 202, a first aperture plate 203, a projection lens 204, a deflector 205, a second aperture plate 206, an objective lens 207, a main deflector 208, and a sub deflector 209. In the writing chamber 103, there is arranged an XY stage 105, on which a target workpiece 101, such as a mask, serving as a writing target is placed. The target workpiece 101 is, for example, a mask for exposure used for manufacturing semiconductor devices, or a mask blank on which resist has been coated and no patterns have been formed.

The control unit 160 includes a control computer unit 110, a memory 112, a control circuit 120, and storage devices 140, 142, and 144, such as a magnetic disk drive. They are mutually connected through a bus (not shown).

In the control computer unit 110, there are arranged a block assignment unit 50, a subfield (SF) layer number determination unit 52, a layer generation unit 54, an assignment unit 56, a shot data generation unit 58, and a writing processing unit 59. Functions of units such as described above may be configured by hardware such as an electronic circuit or may be configured by software such as a program executing these functions. Alternatively, they may be configured by a combination of hardware and software. Information input/output from/to the units described above and information being currently calculated are stored in the memory 112 each time.

Moreover, in the assignment unit 56, there are arranged acquisition units 60 and 62, judgment units 64 and 68, and an assignment processing unit 66. Functions of units such as described above may be configured by hardware such as an electronic circuit or may be configured by software such as a program executing these functions. Alternatively, they may be configured by a combination of hardware and software. Similarly, information input/output from/to the units described above and information being currently calculated are stored in the memory 112 each time.

FIG. 1 shows a structure necessary for describing Embodiment 1. Other structure elements generally necessary for the writing apparatus 100 may also be included. For example, a multi-stage deflector namely the two stage deflector of the main deflector 208 and the sub deflector 209 are herein used for position deflection. A multi-stage deflector of three or more stage deflector may also be used to perform position deflection.

Figure 2:
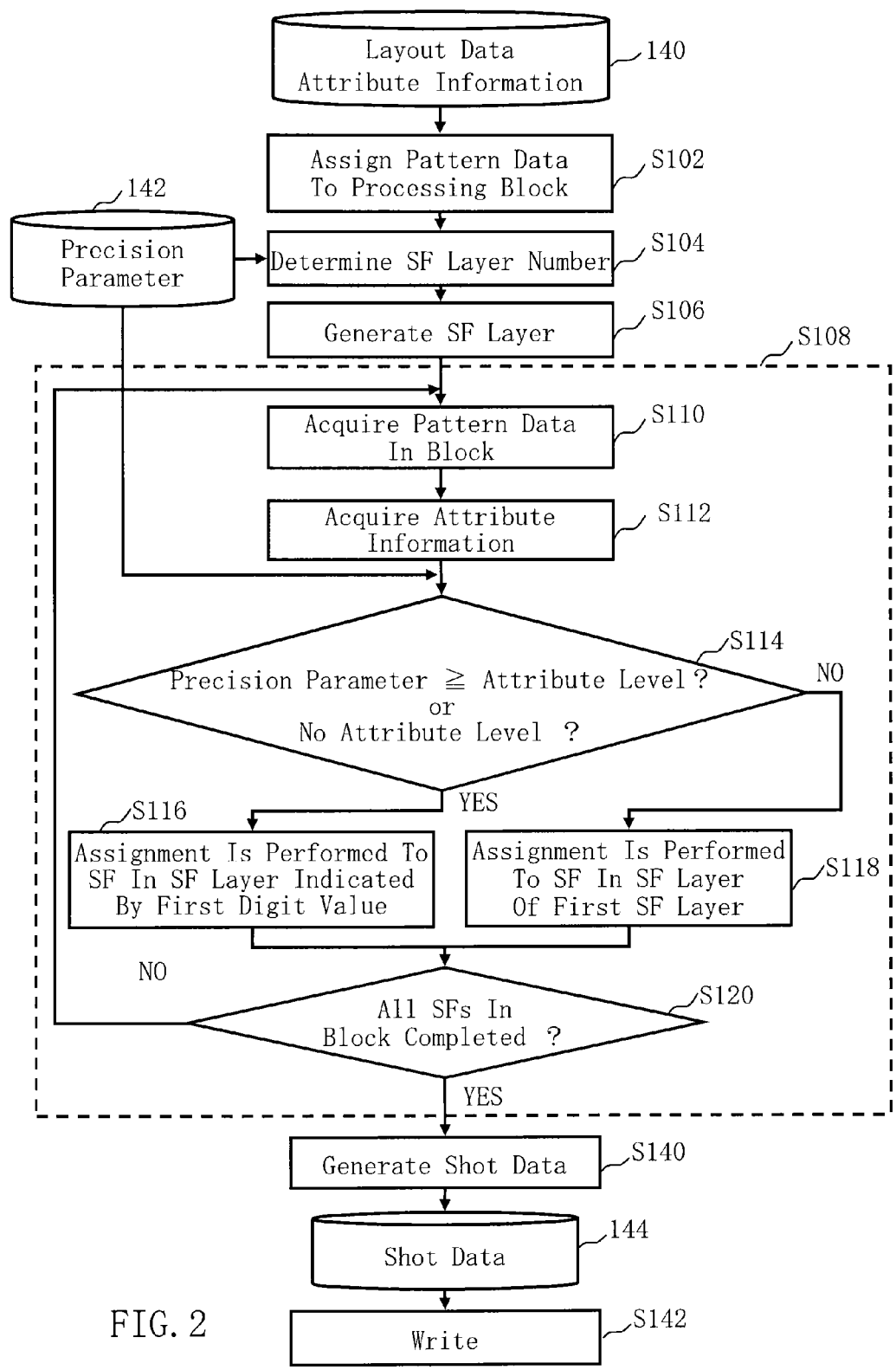
FIG. 2 is a flowchart showing main steps of a writing method according to Embodiment 1.

FIG. 2 is a flowchart showing main steps of a writing method according to Embodiment 1. In FIG. 2, a series of steps is executed: a pattern data assignment step (S102) to a processing block, an SF layer number determination step (S104), an SF layer generation step (S106), an SF assignment step (S108), a shot data generation step (S140), and a writing step (S142). As internal steps in the SF assignment step (S108), a series of steps is executed: a pattern data in block acquisition step (S110), an attribute information acquisition step (S112), a judgment step (S114), an SF assignment step (S116) or (S118), and a judgment step (S120).

Figures 3, 4:
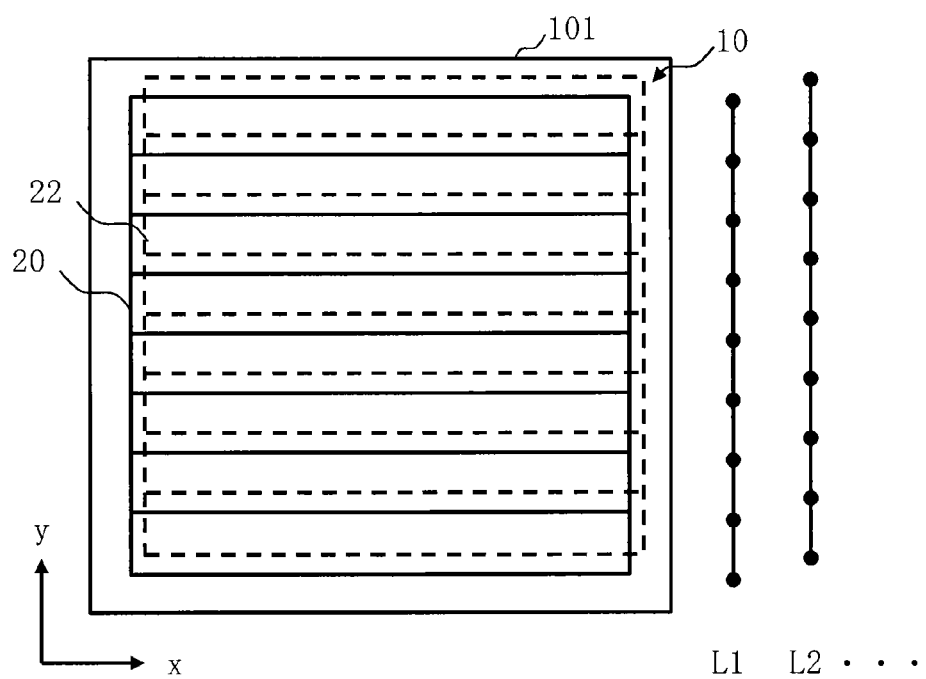
FIG. 3 shows an example of a format of pattern data according to Embodiment 1.
FIG. 4 is a schematic diagram explaining a writing procedure according to Embodiment 1.

FIG. 3 shows an example of a format of pattern data according to Embodiment 1. In FIG. 3, the figure code, the size, the arrangement position, and the attribute information of a figure pattern to be written are defined in the pattern data. In this case, as an example, information on the arrangement position of a figure pattern is also defined in the pattern data. However, it is not limited thereto. For example, arrangement position information may be generated as another file, and, instead of it, an identifier to be linked to the arrangement position information may be defined in the pattern data file.

FIG. 4 is a schematic diagram explaining a writing procedure according to Embodiment 1. In the writing apparatus 100, the writing region of the target workpiece 101 is virtually divided into a plurality of strip-shaped stripe regions 20. FIG. 4 shows the case where one chip is written in the writing region 10 of the target workpiece 101, for example. Needless to say, a plurality of chips may be written in the writing region 10 of the target workpiece 101. Dividing is performed such that the width of the stripe region 20 is to be a width a little smaller than a width deflectable by the main deflector 208.

When writing to the target workpiece 101, the XY stage 105 is continuously moved in the x direction, for example. Thus, the electron beam 200 irradiates one stripe region 20 with continuous movement of the stage. The movement of the XY stage 105 in the x direction is a continuous movement, for example, and the shot position of the electron beam 200 is simultaneously moved by the main deflector 208 to follow the stage movement. By virtue of performing the continuous movement, the writing time can be shortened. Moreover, it is also preferable to further shorten the writing time by moving the XY stage 105 in a variable speed, such as moving in a writable relatively slow speed with respect to a pattern dense region, and moving in a relatively fast speed with respect to a pattern sparse region. After writing one of the stripe regions 20, the XY stage 105 is moved in the y direction by step feeding and the writing operation is performed in the x direction (e.g., reverse direction, this time) for the next one of the stripe regions 20. By performing the writing operation in a zigzag manner respectively for each stripe region 20, the movement time of the XY stage 105 can be shortened.

FIG. 5 is a schematic diagram explaining an SF layer according to Embodiment 1. When writing each stripe region 20, the writing region of the target workpiece 101 is virtually divided into a plurality of mesh-like subfield (SF) regions 30, and the writing is performed for each SF. Dividing is performed such that the width of the SF region 30 is to be a width a little smaller than a width deflectable by the subdeflector 209. The SF region is a minimum deflection region in the regions written by the writing apparatus 100.

FIGS. 6A and 6B show an example of assigning a plurality of figure patterns in an SF to a plurality of SF layers by using attribute information according to Embodiment 1. FIG. 6A shows a layout structure where a plurality of figure patterns 42 each represented by "A" and a plurality of figure patterns 44 each represented by "B" are densely arranged in one SFn. When writing, first, the main deflector 208 deflects the electron beam 200 to the reference position of the SF region to be written. Then, the subdeflector 209 emits a shaped beam per shot to the writing position of each figure pattern in the SF. A figure pattern is written by the procedure of changing the position and the beam shape of each shot and combining the shape of each shot. In that case, it is assumed that a plurality of figure patterns 42 and 44 are densely arranged in one SFn (the n-th SF is herein denoted as SFn) as shown in FIG. 6A. If these densely arranged plural figure patterns 42 and 44 are written continuously, the dose density becomes high, and thus the dimension of written patterns may be changed by the resist heating.

Then, according to Embodiment 1, as shown in FIG. 6B, a plurality of layers are provided for an SF region, and a plurality of figure patterns arranged in one SF region are distributed to a plurality of SF layers. In the example of FIG. 6B, a plurality of figure patterns 42 each represented by "A" are distributed to the SF concerned of the first SF layer that is represented as $SF_{n-1}$. A plurality of figure patterns 44 each represented by "B" are distributed to the SF concerned of the second SF layer, that is represented by $SF_{n-2}$. When distributing, what is necessary is to determine to which SF layer the distribution is sent so that the dose density when written may not be too high. In that case, to which SF layer a figure pattern is to be assigned may be defined as attribute information of the pattern data. In the example of FIG. 6, in the pattern data of the figure pattern 42, the identifier "1" indicating that the figure pattern is to be assigned to the first SF layer is defined as attribute information. In the pattern data of the figure pattern 44, the identifier "2" indicating that the figure pattern is to be assigned to the second SF layer is defined as attribute information. When assigning a figure pattern to an SF, it is possible, by judging the attribute information, to know which SF concerned of SF layer the figure pattern is to be assigned to.

As described above, when writing a layout where a plurality of figures are densely arranged or figures are arranged to be overlapped with each other in the same SF, it is possible, by preparing an SF concerned as a plurality of SF layers and assigning a plurality of figures to one of the plurality of SF layers, to make the density of each SF layer approximately sparse. In other words, it is possible to make the dose density per SF layer lower than the original state. Therefore, with respect to each SF, time has passed since an SF in the first SF layer has been written until the SF concerned in the second SF layer is written, and thereby releasing heat accumulated during the passing time in the resist. Accordingly, pattern dimension variation due to the resist heating can be avoided.

In the case described above, an assignment identifier indicating the SF layer to which a figure pattern is to be assigned is defined as attribute information. It is also preferable that a precision level identifier indicating a required precision level of a figure pattern concerned is also defined in each pattern data.

Figure 7A:
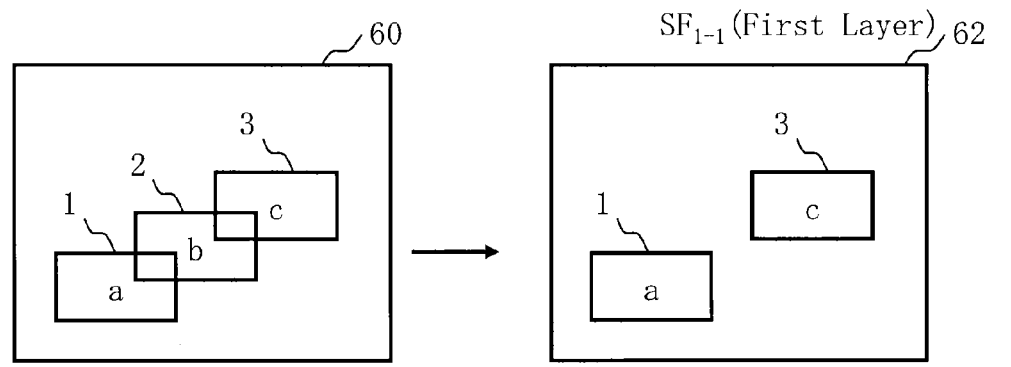
FIGS. 7A and 7B show another example of assigning a plurality of figure patterns in an SF to a plurality of SF layers by using attribute information according to Embodiment 1.
Figure 7B:
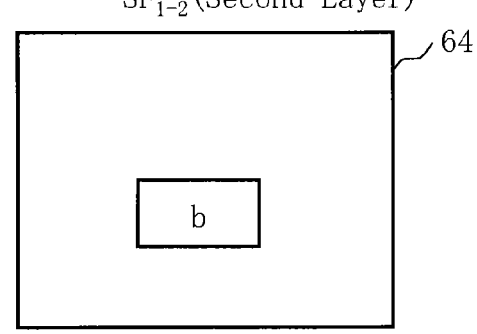

FIGS. 7A and 7B show another example of assigning a plurality of figure patterns in an SF to a plurality of SF layers by using attribute information according to Embodiment 1. FIG. 7A shows the case of an identifier of two digits "x and y", for example, is defined as attribute information. For example, the identifier represented by "y" of the first digit indicates an assignment identifier of the SF layer described above. In other word, a first digit of the attribute information indicates one of a plurality of SF layers in which a plurality of SF regions are respectively arranged. The identifier represented by "x" of the second digit indicates a precision level of the figure pattern concerned. For example, attribute information "11" indicates a figure pattern which is to be assigned to the first SF layer and whose precision level is "1". Attribute information "12" indicates a figure pattern which is to be assigned to the second SF layer and whose precision level is "1". Attribute information "21" indicates a figure pattern which is to be assigned to the first SF layer and whose precision level is "2". Attribute information "22" indicates a figure pattern which is to be assigned to the second SF layer and whose precision level is "2".

FIG. 7A shows the case where three figure patterns 1, 2, and 3 are arranged in an SF 60 (SF1), and it is assumed that a part of these three figure patterns are overlapped with each other. If they are written as they are, the dose density at the overlapping position will become high, and dimension variation will occur due to resist heating. Therefore, as has been described in the above example, figure patterns are assigned to a plurality of SF layers so that overlapping of the figures may be cleared, thereby aiming to avoid resist heating effect. However, if the number of the SF layers increases, the writing time will increase consequently. There are some patterns in which dimension variation may be allowed depending on the precision level required for the figure pattern. Then, such figure patterns are written as they are without performing assignment to a plurality of SF layers. Thereby, the increase of the writing time can be inhibited. According to Embodiment 1, whether figure patterns are assigned to a plurality of SF layers or not is determined by comparing the precision parameter previously stored in the storage device 142 with a precision level identifier (attribute level) defined in each pattern data. Specifically, distribution to a plurality of SF layers is performed only for the pattern data whose precision level indicated by the precision level identifier defined in each pattern data is lower than or equal to the precision parameter which has been input and set in the writing apparatus 100.

FIG. 7A shows the assumption that the attribute information of a figure pattern 1(a) is "21", that of a figure pattern 2(b) is "22", and that of a figure pattern 3(c) is "21. In addition, FIG. 7A shows the case the precision parameter which has been input and set in the writing apparatus 100 is "2". Since the value of the second digit of each attribute information of the three figure patterns 1, 2, and 3 arranged in the SF60 is "2", it corresponds to the case being lower than or equal to the precision parameter. Therefore, it is judged that the three figure patterns 1, 2, and 3 can be distributed to a plurality of SF layers. Then, as shown in FIG. 7B, since the value of the first digit of each attribute information of the figure pattern 1 represented by "a" and the figure pattern 3 represented by "c" is "1", they are distributed to the first layer SF62 ($SF_{1-1}$). On the other hand, since the value of the first digit of the attribute information of the figure pattern 2 represented by "b" is "2", it is distributed to the second layer SF64 ($SF_{1-2}$).

Figure 8A:
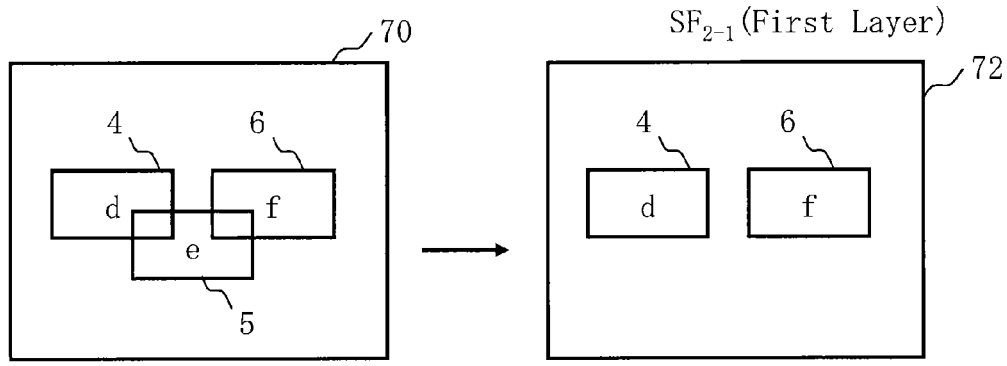
FIGS. 8A and 8B show another example of assigning a plurality of figure patterns in an SF to a plurality of SF layers by using attribute information according to Embodiment 1.
Figure 8B:
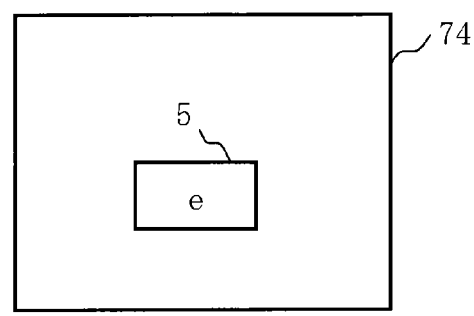

FIGS. 8A and 8B show another example of assigning a plurality of figure patterns in an SF to a plurality of SF layers by using attribute information according to Embodiment 1. FIG. 8A shows the case where three figure patterns 4, 5, and 6 are arranged in an SF70 (SF2), and it is assumed that a part of these three figure patterns are overlapped with each other.

FIG. 8A shows the assumption that the attribute information of a figure pattern 4(d) is "11", that of a figure pattern 5(e) is "12", and that of a figure pattern 6(f) is "11". In addition, FIG. 8 shows the case the precision parameter which has been input and set in the writing apparatus 100 is "2". Since the value of the second digit of each attribute information of the three figure patterns 4, 5, and 6 arranged in the SF70 is "1", it corresponds to the case being lower than or equal to the precision parameter. Therefore, it is judged that each of the three figure patterns 4, 5, and 6 can be distributed to a plurality of SF layers. Then, as shown in FIG. 8B, since the value of the first digit of each attribute information of the figure pattern 4 represented by "d" and the figure pattern 6 represented by "f" is "1", they are distributed to the first layer SF72 ($SF_{2-1}$). On the other hand, since the value of the first digit of the attribute information of the figure pattern 5 represented by "e" is "2", it is distributed to the second layer SF74 ($SF_{2-2}$).

Here, for example, if it is assumed that the precision parameter which has been input and set in the writing apparatus 100 is "1", it will change as follows:

FIGS. 9A and 9B show an assignment state in the case of changing the precision parameter by using the attribute information according to Embodiment 1 shown in FIGS. 7A and 7B. Similarly to the case of FIG. 7A, three figure patterns 1, 2, and 3 are arranged in the SF60 (SF1), and it is assumed that a part of these three figure patterns are overlapped with each other. It is assumed in the example of FIG. 9A, similarly to the case of FIG. 7A, that the attribute information of the figure pattern 1(a) is "21", that of the figure pattern 2(b) is "22", and that of the figure pattern 3(c) is "21". Since the value of the second digit of each attribute information of the three figure patterns 1, 2, and 3 arranged in the SF60 is "2", it does not correspond to the case being lower than or equal to the precision parameter. Therefore, it is judged that any of the three figure patterns 1, 2, and 3 is not able to be distributed to the plurality of SF layers. In that case, as shown in FIG. 9B, all of the three figure patterns 1, 2, and 3 are distributed to the first SF layer SF62 ($SF_{1-1}$).

FIGS. 10A and 10B show an assignment state in the case of changing the precision parameter by using the attribute information according to Embodiment 1 shown in FIGS. 8A and 8B. Similarly to the case of FIG. 8A, three figure patterns 4, 5, and 6 are arranged in the SF70 (SF2), and it is assumed that a part of these three figure patterns are overlapped with each other. It is assumed in the example of FIG. 10A, similarly to the case of FIG. 8A, that the attribute information of the figure pattern 4(d) is "12", that of the figure pattern 6(f) is "11", and that of the figure pattern 5(e) is "11". Since the value of the second digit of each attribute information of all the three figure patterns 4, 5, and 6 arranged in the SF70 is "1", it corresponds to the case being lower than or equal to the precision parameter. Therefore, it is judged that all of the three figure patterns 4, 5, and 6 are able to be distributed to a plurality of SF layers. Then, as shown in FIG. 10B, the value of the first digit of each attribute information of the figure pattern 4 represented by "d" and the figure pattern 6 represented by "f" is "1", they are able to be distributed to the first layer SF72 ($SF_{2-1}$). On the other hand, since the value of the first digit of the attribute information of the figure pattern 5 represented by "e" is "2", it is distributed to the second layer SF74 (SF2-2).

By virtue of the structure described above in which whether an SF layer is to be divided or not is determined according to the precision parameter and the precision level of each pattern data, it is possible only with respect to figure patterns which are required to have high dimension accuracy to avoid pattern dimension variation caused by resist heating, by distributing the figure patterns to a plurality of SF layers. On the other hand, figure patterns not required to have high dimension accuracy are not deliberately assigned to a plurality of SF layers in order to be continuously written in the same layer, thereby inhibiting the increase of the writing time. Although the case where the precision level of each pattern data is "1" or "2" has been described above, it is not limited thereto, and it may be a value "3" or more. Similarly, although the case where the value of the precision parameter is "1" or "2" has been described above, it is not limited thereto, and it may be a value "3" or more. What is necessary is to perform determining based on whether the precision level of each pattern data is lower than or equal to the precision parameter or not. Although the case where the smaller the value of the precision level of each pattern is, the higher the precision is required has been described, it is not limited thereto. On the contrary, if it is set that the larger the value of the precision level of each pattern is, the higher the precision is required, the determining can be performed based on whether the precision level of each pattern data is greater than or equal to the precision parameter or not.

In the examples of FIGS. 6A-10B, since the first digit of attribute information is "1" or "2", namely two layers, consequently, two SF layers are generated. Then, first, in order to configure the second SF layer, the writing region 10 is virtually divided into a plurality of stripe regions 22 of the second layer as shown in FIG. 4. Then, as shown in FIG. 5, each stripe region 20 of the first layer is virtually divided into a plurality of SF regions 30. The first SF layer is configured by the plurality of these SF regions 30. Similarly, each stripe region 22 of the second layer is virtually divided into a plurality of SF regions 40. Then, the second SF layer is configured by the plurality of these SF regions 40. FIG. 5 shows the case where the first SF layer and the second SF layer are arranged mutually shifted by c1 smaller than the SF size in the y direction and by c2 smaller than the SF size in the x direction. For example, they are mutually shifted by ½ of the SF size in the x and y directions. By shifting, combination precision of the pattern can be improved between stripe regions and between SFs in the stripe region. Moreover, h which is the division width (division height) in the y direction of the stripe regions 20 and 22 is configured to be smaller than the main deflection width D deflectable by the main deflector 208. Here, both the shifted stripe region 20 and stripe region 22 are arranged to be within the deflectable region. That is, it is configured to be D≥h+c1. By controlling to have such a dimension, it becomes possible to write both the stripe region 20 and the stripe region 22 while continuously moving the XY stage 105 in the x direction. In other words, even if the XY stage 105 is not returned, both the stripe regions 20 and 22 can be written by a run corresponding to one-time writing.

Hereafter, the writing method performed in the writing apparatus 100 according to Embodiment 1 will be described in order of steps.

First, layout data (writing data) is input from outside the apparatus into the storage device 140 (an example of a storage unit) to be stored. In the layout data, there is defined each pattern data of a plurality of figure patterns to be arranged in each small region of a plurality of small regions made by virtually dividing the writing region of the target workpiece to be written on which resist has been coated. Moreover, in each pattern data, there is defined for each figure pattern an assignment identifier to assign a figure pattern concerned to one of a plurality of SF layers (an example of a plurality of groups) in the SF (small region) to which the figure pattern concerned belongs. In this case, the assignment identifier is added as attribute information described above. Each of these pattern data is stored in the storage device 140. Moreover, for example, information on a precision parameter is input from outside the apparatus into the storage device 142 to be stored. However, when the precision level identifier is not defined as the attribute information for each pattern data, the information on the precision parameter is not necessarily needed. Each structure operates as described below under the control of the writing processing unit 59.

In the pattern data assignment step (S102) to a processing block, the block assignment unit 50 virtually divides the stripe region 20 into a plurality of data processing blocks, and assigns pattern data concerned to each processing block. Data processing is performed, in each processing block, for pattern data of a figure pattern arranged in the processing block concerned. Each stripe region 20 is divided into a plurality of processing blocks, and it is preferable to perform data processing in parallel for the plurality of processing blocks, according to the number of CPUs, etc. installed in the control computer 110. Hereinafter, in Embodiment 1, pattern data processing in one processing block will be described.

In the SF layer number determination step (S104), the SF layer number determination unit 52 reads attribute information of each pattern data in the processing block concerned, and determines the number of SF layers needed. In the example of FIGS. 6 to 10, since the first digit of the attribute information is "1" or "2", the number of SF layers is determined to be two layers. In the case that a precision level identifier is defined as attribute information in each pattern data, the SF layer number determination unit 52 needs to read the precision parameter from the storage device 142, and to determine the number of SF layers, according to the value of the first digit of the attribute information, only for the pattern data whose precision level of the second digit of the attribute information is lower than or equal to the precision parameter. Specifically, if the cases shown in FIGS. 9 and 10 are mixed, it is determined to be the number of SF layers of FIG. 10 because the number is larger than that of FIG. 9.

In the SF layer generation step (S106), the layer generation unit 54 generates a plurality of SF layers in which a plurality of SFs (small regions) are respectively arranged. Concretely, the layer generation unit 54 generates SF layers according to a determined SF layer number. In the examples of FIGS. 6 to 10, two SF layers are generated. In the example of FIG. 5, the first SF layer is configured by a plurality of SF regions 30. Similarly, the second SF layer is configured by a plurality of SF regions 40.

In the SF assignment step (S108), the assignment unit 56 assigns each pattern data to each SF (small region) concerned to be arranged in the SF concerned such that writing order is sorted per SF layer (group). Since writing is performed per SF, when writing an SF in the first SF layer, there is no writing the corresponding SF in the second layer, for example. Therefore, when assigning pattern data of one group (group whose first digit of attribute information is "1") to $SF_{n-1}$ of the first SF layer, and assigning pattern data of the other group (group whose first digit of attribute information is "2") to corresponding $SF_{n-2}$ of the second SF layer, the writing order is sorted per group at the time of writing. Moreover, the assignment unit 56 judges each pattern data whether distribution is sent to a group indicated by the assignment identifier or not depending on the precision level identifier. Then, as a result of the judgment, when not distributing to a group indicated by the assignment identifier, the pattern data concerned is assigned to one of a plurality of groups which is different from the group indicated by the assignment identifier. In other words, pattern data concerned is assigned to an SF in one of the SF layers. Specifically, as internal steps in the SF assignment step (S108), the steps described below will be performed.

In the pattern data in block acquisition step (S110), the acquisition unit 60 acquires pattern data assigned to a processing block concerned.

In the attribute information acquisition step (S112), the acquisition unit 62 refers to and acquires attribute information from each pattern data.

In the judgment step (S114), the judgment unit 64 reads the precision parameter from the storage device 142, and judges each pattern data whether the precision level of the attribute information is lower than or equal to the precision parameter. Alternatively, it judges whether a precision level identifier exists in the attribute information or not. When the precision level of the attribute information is lower than or equal to the precision parameter, or when there is no precision level identifier, it goes to the SF assignment step (S116). When the precision level of the attribute information is not lower than or equal to the precision parameter, it goes to the SF assignment step (S118).

The assignment processing unit 66 assigns each pattern data to an SF in one of a plurality of SF layers such that each of the SF layers becomes different per group. Specifically, the assignment is performed as follows:

In the SF assignment step (S116), with respect to pattern data whose precision level of the attribute information is lower than or equal to the precision parameter or pattern data which includes no precision level identifier, the assignment processing unit 66 assigns the pattern data to a corresponding SF in the SF layer indicated by the first digit of the attribute information.

In the SF assignment step (S118), with respect to pattern data whose precision level of the attribute information is not lower than or equal to the precision parameter, the assignment processing unit 66 assigns the pattern data to a corresponding SF in the first SF layer.

In the judgment step (S120), the judgment unit 68 judges whether the SF assignment processing has been completed for all the SFs in the processing block or not. If there is an SF for which the SF assignment processing has not been finished, it returns to S110 to repeat from S110 to S120 until the SF assignment processing has been completed for all the SFs in the processing block.

In the shot data generation step (S140), with respect to the pattern data for which the SF assignment processing has been completed, the shot data generation unit 58 performs data conversion processing of several steps and generates shot data unique to the apparatus. For writing a figure pattern by the writing apparatus 100, it is necessary to divide each figure pattern so as to have the size which can be irradiated by one beam shot. Therefore, the shot data generation unit 58 divides a figure pattern indicated by each pattern data so as to have the size which can be irradiated by one beam shot, in order to generate a shot figure. Then, shot data is generated for each shot figure. In the shot data, a figure type, a figure size, an irradiation position, and a dose are defined, for example. The shot data is defined per SF in the SF layer concerned in order, for each SF layer. The generated shot data is temporarily stored in the storage device 144 one by one.

In the writing step (S142), the writing processing unit 59 controls the control circuit 120 to make the writing unit 150 perform writing processing. The control circuit 120 reads shot data from the storage device 144 one by one, and controls the writing unit 150 to write each figure pattern on a desired position of the target workpiece 101. The writing unit 150 writes each figure pattern in the SF concerned per group by using the electron beam 200. Writing is performed for each stripe according to the SF order described below, for example.

FIGS. 11A to 11E show an example of a writing order according to Embodiment 1. In the example of FIGS. 11A to 11E, with respect to each stripe, the writing operation is controlled such that writing of the first SF layer and writing of the second SF layer are alternately repeated per SF region group composed of a plurality of SF regions arranged in the direction (y direction) perpendicular to the moving direction (x direction) of the XY stage 105. According to the controlling as shown in FIG. 11A, first, with respect to the first column of the first SF layer, writing is performed starting from the lower left SF region 30 in the y direction in order. After the entire first column of the first SF layer in the target stripe region 20 has been written, next, with respect to the first column of the second SF layer as shown in FIG. 11B, writing is performed starting from the lower left SF region 40 in the y direction in order. Then, after the entire first column of the second SF layer in the target stripe region 22 has been written, next, with respect to the second column of the first SF layer as shown in FIG. 11C, writing is performed starting from the lower left SF region 30 in the y direction in order. After the entire second column of the first SF layer in the target stripe region 20 has been written, next, with respect to the second column of the second SF layer as shown in FIG. 11D, writing is performed starting from the lower left SF region 40 in the y direction in order. Similarly, one stripe region 20 and one stripe region 22 are written as shown in FIG. 11E by alternately repeating the writing of the first SF layer and the second SF layer per SF column.

While the XY stage 105 is continuously moving in the x direction (predetermined direction), the writing unit 150 alternately repeats writing the first SF layer and the second SF layer per SF column, using the electron beam 200, as shown in FIGS. 11A to 11E. Specifically, it operates as follows:

The electron beam 200 emitted from the electron gun assembly 201 (emission unit) irradiates the entire first aperture plate 203 having a quadrangular, such as a rectangular, opening by the illumination lens 202. At this point, the electron beam 200 is shaped to be a quadrangle such as a rectangle. Then, after having passed through the first aperture plate 203, the electron beam 200 of a first aperture image is projected onto the second aperture plate 206 by the projection lens 204. The first aperture image on the second aperture plate 206 is deflection-controlled by the deflector 205 so as to change the shape and size of the beam. After having passed through the second aperture plate 206, the electron beam 200 of a second aperture image is focused by the objective lens 207 and deflected by the main deflector 208 and the sub-deflector 209, and reaches a desired position on the target workpiece 101 on the XY stage 105 which continuously moves. FIG. 1 shows the case of using a multi-stage deflection, namely the two stage deflector of the main and sub deflectors, for the position deflection. In such a case, what is needed is to deflect the electron beam 200 of the shot concerned to the reference position of SF, which is made by virtually dividing the stripe region, by using the main deflector 208 while following the stage movement, and to deflect the beam of the shot concerned to each irradiation position in the SF by using the sub-deflector 209.

When the writing operation progresses in accordance with the writing order described above, it is possible to continuously write the first SF layer and the second SF layer by a run corresponding to one-time writing without returning the position of the XY stage 105.

As described above, the writing unit 150 writes each figure pattern arranged in each SF by process of, after writing a figure pattern assigned to an SF concerned in one SF layer, writing a figure pattern assigned to a corresponding SF in another SF layer. By virtue of this structure, after writing an SF in the first layer, the heat generated when writing the SF in the first layer can be released by the time of writing an SF in the second layer. Therefore, pattern dimension variation due to resist heating can be suppressed.

Embodiment 2

In Embodiment 1, pattern dimension variation is avoided by dividing an SF into a plurality of SF layers and assigning a plurality of figures arranged densely or arranged overlappingly to one of the plurality of SF layers. However, the method of avoiding pattern dimension variation due to resist heating is not limited thereto. In Embodiment 2, there will be explained a method of avoiding pattern dimension variation due to resist heating without dividing an SF into a plurality of SF layers.

Figure 12:
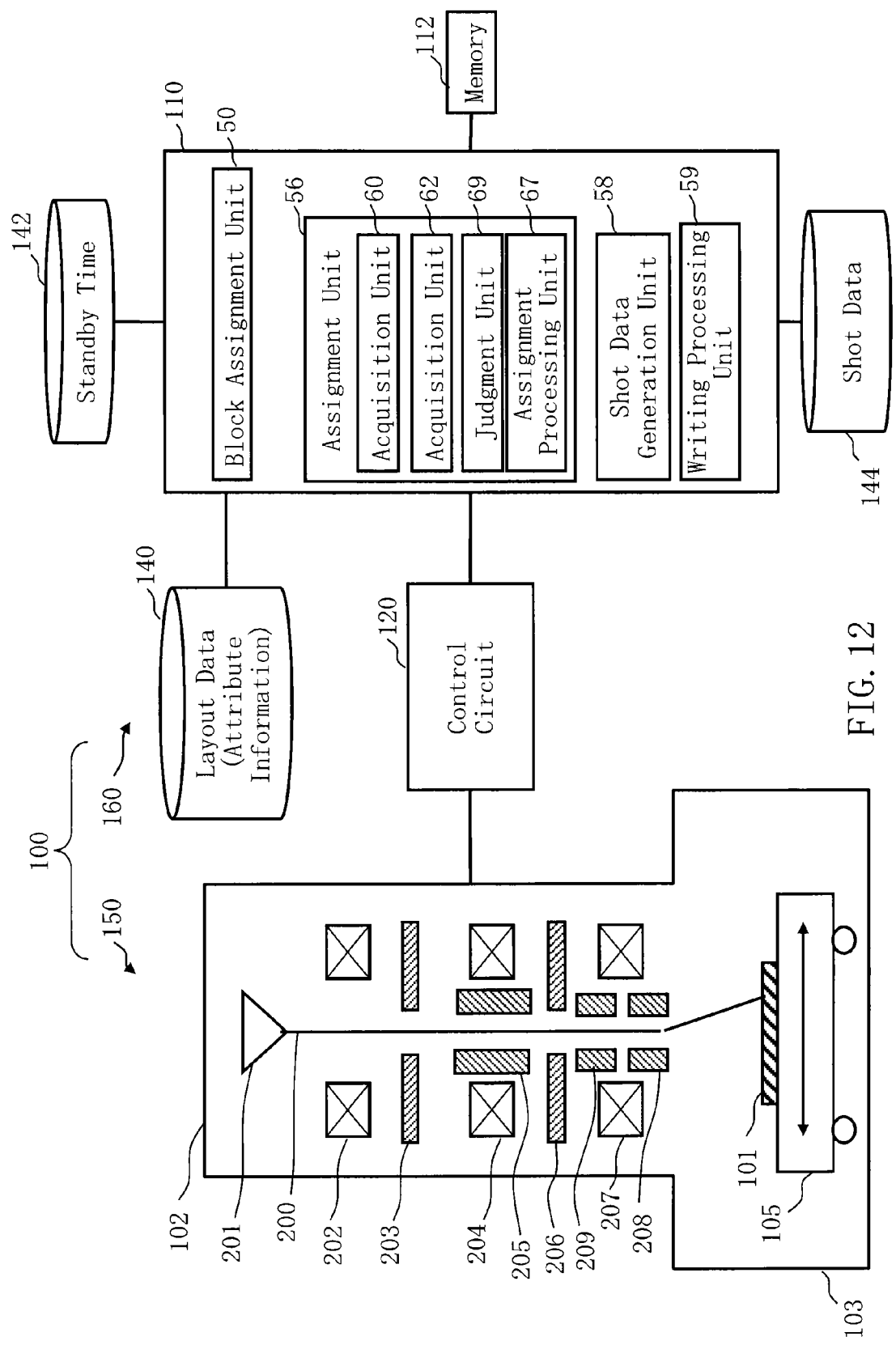
FIG. 12 is a schematic diagram showing a structure of a writing apparatus according to Embodiment 2.

FIG. 12 is a schematic diagram showing a structure of a writing apparatus according to Embodiment 2. FIG. 12 is the same as FIG. 1 except for that the SF layer number determination unit 52, the layer generation unit 54, and the judgment unit 64 are removed, the judgment unit 69 is arranged instead of the judgment unit 68, and the assignment processing unit 67 is arranged instead of the assignment processing unit 66. Functions, such as the block assignment unit 50, the assignment unit 56, the shot data generation unit 58, and the writing processing unit 59 may be configured by hardware such as an electronic circuit or may be configured by software such as a program executing these functions. Alternatively, they may be configured by a combination of software and hardware. Information input/output from/to the units described above and information being currently calculated are stored in the memory 112 each time. Functions, such as the acquisition units 60 and 62, the judgment unit 69, and the assignment processing unit 67 may be configured by hardware such as an electronic circuit or may be configured by software such as a program executing these functions. Alternatively, they may be configured by a combination of software and hardware. Information input/output from/to the units described above and information being currently calculated are similarly stored in the memory 112 each time.

Figure 13:
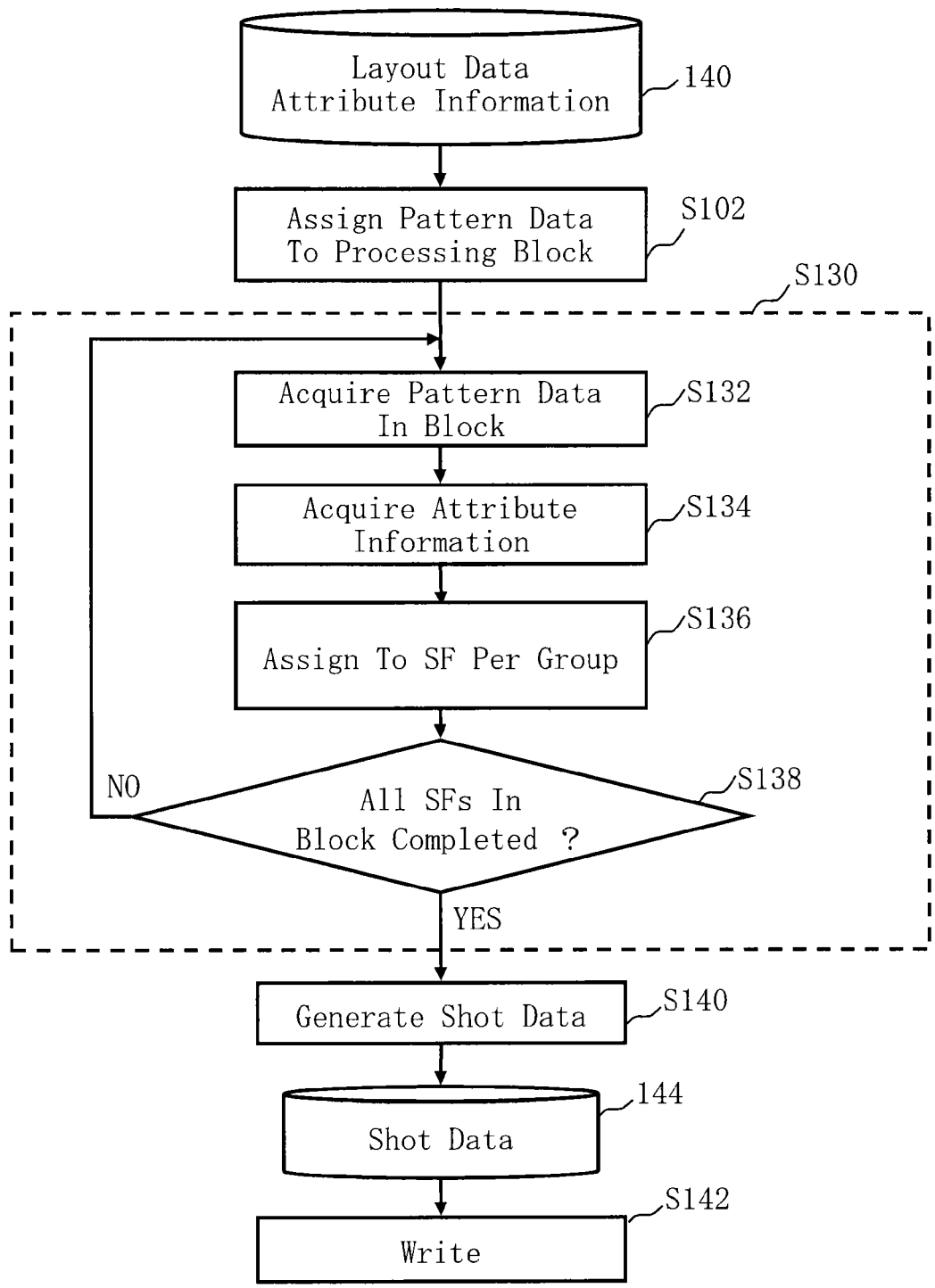
FIG. 13 is a flowchart showing main steps of a writing method according to Embodiment 2.

FIG. 13 is a flowchart showing main steps of the writing method according to Embodiment 2. In FIG. 13, a series of steps is executed: a pattern data assignment step (S102) to a processing block, an SF assignment step (S130), a shot data generation step (S140), and a writing step (S142). In the SF assignment step (S130), a series of steps is executed as its internal steps: a pattern data in block acquisition step (S132), an attribute information acquisition step (S134), an SF assignment step (S136), and a judgment step (S138). Contents that are not specially explained are the same as those in Embodiment 1.

Figures 14A, 14B:
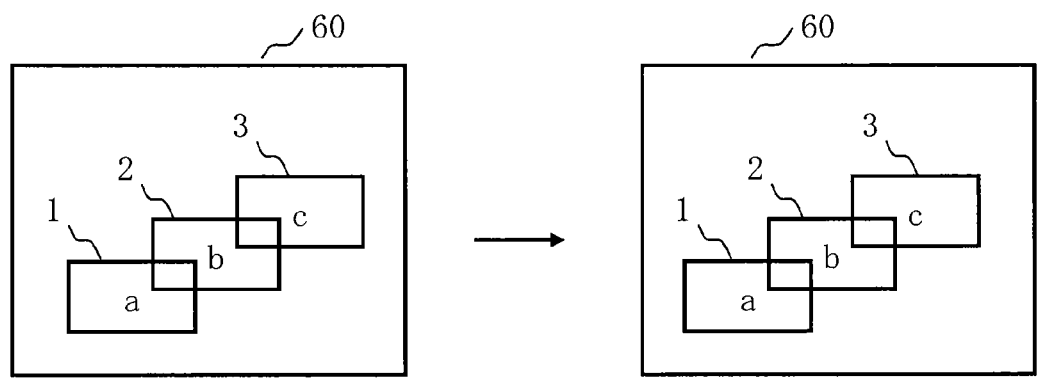
FIGS. 14A and 14B show an example of writing a plurality of figure patterns in an SF by using attribute information according to Embodiment 2.

FIGS. 14A and 14B show an example of writing a plurality of figure patterns in an SF by using attribute information according to Embodiment 2. FIG. 4A shows the case where three figure patterns 1, 2, and 3 are arranged in the SF 60 (SF1), and it is assumed that a part of these three figure patterns are overlapped with each other. If they are written as they are, the dose density at the overlapping position will become high, and dimension variation will occur due to resist heating. Then, according to Embodiment 2, "z" being an identifier of one digit is defined as attribute information. For example, the identifier represented by "z" is an example of an assignment identifier for distributing a plurality of figure patterns in an SF to a plurality of groups. For example, attribute information "1" indicates that a figure pattern is to be distributed to the first group. Attribute information "2" indicates that a figure pattern is to be distributed to the second group.

FIG. 14A shows the assumption that the attribute information of the figure pattern 1(a) is "1", that of the figure pattern 2(b) is "2", and that of the figure pattern 3(c) is "1". Then, as shown in FIG. 14B, since the value of the attribute information of the figure pattern 1 represented by "a" and the figure pattern 3 represented by "c" is "1", they are to be distributed to the first group. On the other hand, since the value of the attribute information of the figure pattern 2 represented by "b" is "2", it is to be distributed to the second group. The pattern data of the three figure patterns 1, 2, and 3 are to be assigned to the same SF 60.

First, layout data (writing data) is input from outside the apparatus into the storage device 140 (an example of a storage unit) to be stored. In the layout data, as described above, there is defined each pattern data of a plurality of figure patterns to be arranged in each SF of a plurality of SFs made by virtually dividing the writing region of the target workpiece to be written on which resist has been coated. Moreover, in each pattern data, there is defined for each figure pattern an assignment identifier to assign a figure pattern concerned to one of a plurality of groups in an SF (small region) to which the figure pattern concerned belongs. In this case, the assignment identifier is added as attribute information described above. Each of these pattern data is stored in the storage device 140. Moreover, information on a standby time for waiting for writing between groups is input from the outside into the storage device 142 to be stored. The standby time may be different depending on the pattern data. Therefore, it is acceptable there is a plurality of information on the standby time.

The contents of the pattern data assignment step (S102) to a processing block are the same as those of Embodiment 1.

In the SF assignment step (S130), the assignment unit 56 assigns each pattern data to each SF (small region) concerned to be arranged in the SF concerned such that writing order is sorted per group. The assignment unit 56 is an example of the assignment processing unit. After pattern data of one group (group whose attribute information is "1") has been written and the standby time having been set has passed, pattern data of another group (group whose attribute information is "2") is written. By this, the writing order is sorted per group at the time of writing. In the SF assignment step (S130), the following steps will be specifically executed as its internal steps.

In the pattern data in block acquisition step (S132), the acquisition unit 60 acquires pattern data assigned to a processing block concerned.

In the attribute information acquisition step (S134), the acquisition unit 62 refers to and acquires attribute information from each pattern data.

In the SF assignment step (S136), when assigning pattern data of a figure pattern in an SF to each SF, the assignment processing unit 67 controls the definition order of pattern data so that the pattern data may be sorted per group.

Figure 15:
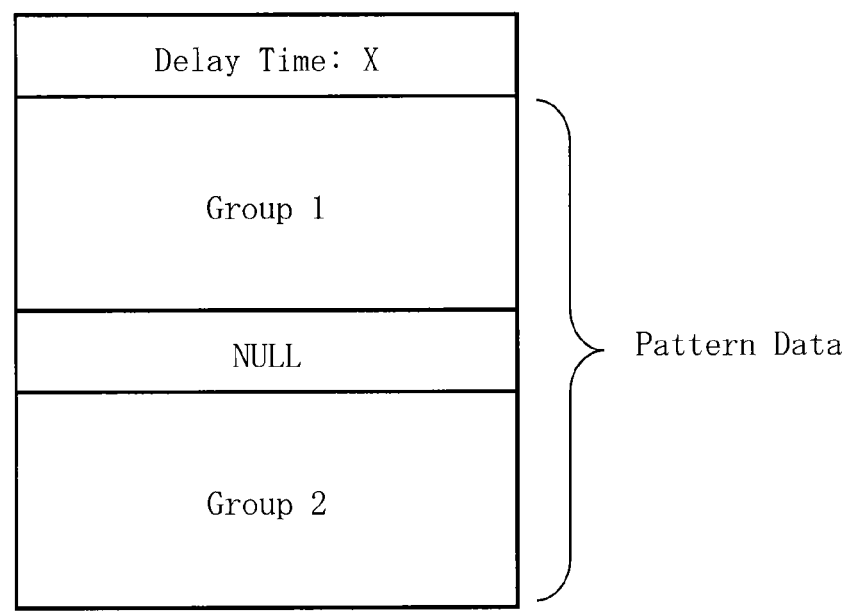
FIG. 15 shows an example of a pattern data file according to Embodiment 2.
Figure 16:
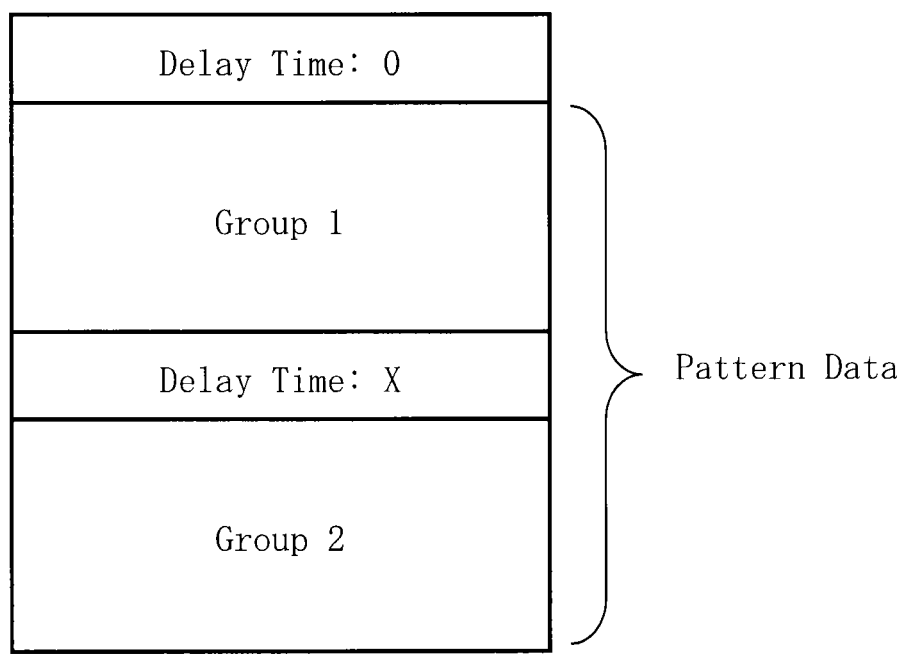
FIG. 16 shows another example of the pattern data file according to Embodiment 2.
Figure 17:
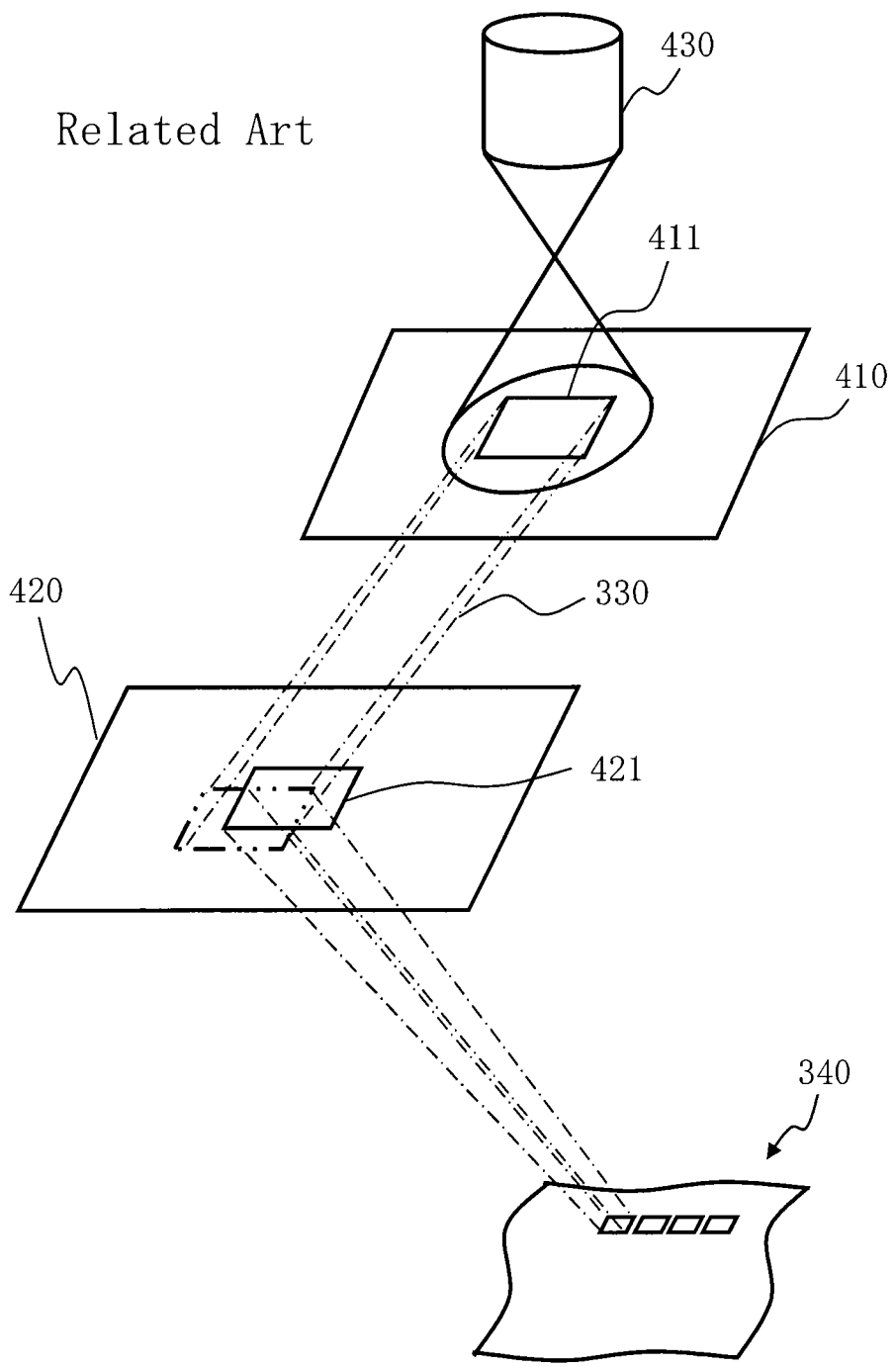
FIG. 17 is a schematic diagram explaining operations of a variable-shaped electron beam writing apparatus.

FIG. 15 shows an example of a pattern data file according to Embodiment 2. First, the assignment processing unit 67 reads data on the standby time from the storage device 142. The standby time is defined as shown in FIG. 15. Then, the pattern data belonging to a group 1 (first group) is defined in order. Next, NULL data for identifying a boundary between groups is defined. Since NULL data represents nothing, it can be substantially expressed by making a space. Then, pattern data belonging to a group 2 (second group) is defined in order. When there are three or more groups, what is necessary is to define pattern data of each group in order through the NULL data. Alternatively, it is also preferable to configure a pattern data file as follows:

FIG. 16 shows another example of the pattern data file according to Embodiment 2. First, the assignment processing unit 67 reads data on standby time from the storage device 142. Then, the standby time of the group 1 (first group) is defined as shown in FIG. 16. Since the group 1 does not need standby time, it may be defined as "0". Next, pattern data belonging to the group 1 is defined in order. Then, the standby time of the group 2 (second group) is defined. The standby time read from the storage device 142 can be defined as a standby time X of the group 2. Then, pattern data belonging to the group 2 is defined in order. When there are three or more groups, what is necessary is to define pattern data of each group in order through the standby time X.

In the judgment step (S138), the judgment unit 69 judges whether the SF assignment processing has been completed for all the SFs in the processing block or not. If there is an SF for which the SF assignment processing has not been finished, it returns to S132 to repeat from S132 to S138 until the SF assignment processing has been completed for all the SFs in the processing block.

The shot data generation step (S140) is the same as that of Embodiment 1. In the writing step (S142), the writing processing unit 59 controls the control circuit 120 to make the writing unit 150 perform writing processing. The control circuit 120 reads shot data from the storage device 144 one by one, and controls the writing unit 150 to write each figure pattern on a desired position of the target workpiece 101. When writing a pattern in an SF, the writing unit 150 provides a standby time between groups and writes each figure pattern for each group. What is necessary for the standby time is to set it to be a time period for releasing the heat accumulated by the previous group writing.

That is, when the writing unit 150 writes each figure pattern arranged in each SF, the heat accumulated by the writing of the previous group can be released by providing a standby time between groups. Therefore, pattern dimension variation by resist heating can be suppressed.

Referring to specific examples, Embodiments have been described above. However, the present invention is not limited to these examples.

While the apparatus structure, control method, etc. not directly necessary for explaining the present invention are not described, some or all of them may be suitably selected and used when needed. For example, although description of the structure of a control unit for controlling the writing apparatus 100 is omitted, it should be understood that some or all of the structure of the control unit is to be selected and used appropriately when necessary.

In addition, any other charged particle beam writing apparatus and method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
    a storage unit configured to store each pattern data of a plurality of figure patterns arranged in each of a plurality of small regions made by virtually dividing a writing region of a target workpiece to be written on which resist has been coated, wherein the each pattern data includes a figure code of a pattern, a size of the pattern, an arrangement position of the pattern, and an attribute information which is an assignment identifier for assigning the each of the plurality of figure patterns concerned in one of the plurality of small regions to which the plurality of figure patterns concerned belongs, to one of a plurality of groups, defined for each of the plurality of figure patterns, wherein the plurality of groups are one of a plurality of groups which are not corresponding to a region and a plurality of layers in which the plurality of small regions are respectively arranged;
    an assignment unit configured to assign each figure pattern in one of the plurality of small regions to one of the plurality of groups using the assignment identifier, to make a dose density per the one of the plurality of groups lower than an original state in a same one of the plurality of small regions; and
    a writing unit configured to write, for each of the plurality of groups, the each figure pattern in the each of the plurality of small regions concerned by using a charged particle beam, the writing unit including a deflector deflecting the charged particle beam to a reference position of the each of the plurality of small regions, a predetermined time being provided between groups of the plurality of groups in case of writing the each figure pattern for the each of the plurality of groups.

2. The apparatus according to claim 1, further comprising:
    a layer generation unit configured to generate the plurality of layers in which the plurality of small regions are respectively arranged,
    wherein the assignment unit assigns the each pattern data to one of the plurality of small regions in one of the plurality of layers such that each of the plurality of layers is different per group of the plurality of groups, and
    the writing unit, when writing the each figure pattern arranged in the each of the plurality of small regions, after writing one of the plurality of figure patterns assigned to one of the plurality of small regions concerned in one of the plurality of layers, writes another of the plurality of figure patterns assigned to the one of the plurality of small regions concerned in another of the plurality of layers.

3. The apparatus according to claim 1, wherein
    the each pattern data further includes a precision level identifier that indicates a necessary precision level of one of the plurality of figure patterns concerned, and
    the assignment unit judges the each pattern data whether the each pattern data concerned is to be distributed to one of the plurality of groups indicated by the assignment identifier, depending on the precision level identifier, and, as a result of judgment, when not distributing the pattern data concerned to the one of the plurality of groups indicated by the assignment identifier, assigns the pattern data concerned to another of the plurality of groups which is different from the one of the plurality of groups indicated by the assignment identifier.

4. The apparatus according to claim 1, wherein
    the writing unit provides a standby time corresponding to each group of the plurality of groups, the standby time being determined to release heat accumulated by writing the plurality of figure patterns assigned to the corresponding group, and writes each of the plurality of figure patterns for each of the plurality of groups after waiting the standby time corresponding to the previous group.

5. The apparatus according to claim 1, wherein
    the assignment unit further includes an acquisition unit, which is configured to acquire pattern data from the storage unit.

6. The apparatus according to claim 5, wherein
    the assignment unit further includes an another acquisition unit, which is configured to acquire attribute information from each acquired pattern data.

7. The apparatus according to claim 6, further comprising:
    a storage device configured to store a precision parameter,
    wherein the attribute information has a precision level identifier that indicates a necessary precision level, and
    the assignment unit further includes a judgment unit configured to read the precision parameter from the storage device and judge the each pattern data whether a precision level of the attribute information is lower than or equal to the precision parameter.

8. The apparatus according to claim 7, wherein a first digit of the attribute information indicates one of a plurality of layers in which the plurality of small regions are respectively arranged, and
    the assignment unit further includes an assignment processing unit configured to assign, with respect to pattern data whose precision level of the attribute information is lower than or equal to the precision parameter or pattern data which includes no precision level identifier, the pattern data concerned to a corresponding small region of the plurality of small regions in a layer indicated by a first digit of the attribute information.

9. The apparatus according to claim 8, wherein
    the assignment processing unit, with respect to pattern data whose precision level of the attribute information is not lower than or equal to the precision parameter, assigns the pattern data concerned to a corresponding small region of the plurality of small regions in a first layer.

10. The apparatus according to claim 1, further comprising:
- a layer generation unit configured to generate a plurality of layers in which the plurality of small regions are respectively arranged, and
- a storage device configured to store a precision parameter,
- wherein the assignment unit assigns the each pattern data to one of the plurality of small regions in one of the plurality of layers such that each of the plurality of layers is different per group of the plurality of groups, and
- the writing unit, when writing the each figure pattern arranged in the each of the plurality of small regions, after writing one of the plurality of figure patterns assigned to one of the plurality of small regions concerned in one of the plurality of layers, writes another of the plurality of figure patterns assigned to the one of the plurality of small regions concerned in another of the plurality of layers,
- wherein the each pattern data includes attribute information having a precision level identifier that indicates a necessary precision level, a first digit of the attribute information indicates one of a plurality of layers in which the plurality of small regions are respectively arranged, and
- the assignment unit further includes
- an acquisition unit configured to acquire the pattern data from the storage unit,
- an acquisition unit configured to acquire attribute information from each acquired pattern data,
- a judgment unit configured to read the precision parameter from the storage device, and judge the each pattern data whether the precision level of the attribute information is lower than or equal to the precision parameter, and
- an assignment processing unit configured, with respect to pattern data whose precision level of the attribute information is lower than or equal to the precision parameter or pattern data which includes no precision level identifier, to assign the pattern data concerned to a corresponding small region of the plurality of small regions in a layer indicated by a first digit of the attribute information,
- wherein the assignment processing unit, with respect to pattern data whose precision level of the attribute information is not lower than or equal to the precision parameter, assigns the pattern data concerned to a corresponding small region of the plurality of small regions in a first layer.

11. The apparatus according to claim 1, further comprising:
- a storage device configured to store a precision parameter,
- wherein the each pattern data further includes a precision level identifier that indicates a necessary precision level of one of the plurality of figure patterns concerned, and
- the assignment unit includes
- an acquisition unit configured to acquire the pattern data from the storage unit,
- an acquisition unit configured to acquire the precision level identifier from each acquired pattern data,
- a judgment unit configured to read the precision parameter from the storage device, and judge the each pattern data whether the each pattern data concerned is to be distributed to one of the plurality of groups indicated by the assignment identifier depending on the precision level identifier, and
- an assignment processing unit configured, with respect to pattern data distributed to the one of the plurality of groups indicated by the assignment identifier, to assign the pattern data concerned to the one of the plurality of groups indicated by the assignment identifier,
- wherein the assignment processing unit, with respect to pattern data not distributed to the one of the plurality of groups indicated by the assignment identifier, assigns the pattern data concerned to another of the plurality of groups which is different from the one of the plurality of groups indicated by the assignment identifier, and
- the writing unit provides standby time between groups of the plurality of groups, and writes each of the plurality of figure patterns for each of the plurality of groups.

12. A charged particle beam writing method comprising:
- storing, in a storage device, each pattern data of a plurality of figure patterns arranged in each of a plurality of small regions made by virtually dividing a writing region of a target workpiece to be written on which resist has been coated, wherein the each pattern data includes a figure code of a pattern, a size of the pattern, an arrangement position of the pattern, and an attribute information which is an assignment identifier for assigning the each of the plurality of figure patterns concerned in one of the plurality of small regions to which the plurality of figure patterns concerned belongs, to one of a plurality of groups, defined for each of the plurality of figure patterns, wherein the plurality of groups are one of a plurality of groups which are not corresponding to a region and a plurality of layers in which the plurality of small regions are respectively arranged;
- reading the each pattern data from the storage device, and assigning each figure pattern in one of the plurality of small regions to one of the plurality of groups using the assignment identifier, to make a dose density per the one of the plurality of groups lower than an original state in a same one of the plurality of small regions; and
- writing, for each of the plurality of groups, the each figure pattern in the each of the plurality of small regions concerned by using a charged particle beam, the writing unit including a deflector deflecting the charged particle beam to a reference position of the each of the plurality of small regions, a predetermined time being provided between groups of the plurality of groups in case of writing the each figure pattern for the each of the plurality of groups.

13. The apparatus according to claim 1, wherein the assignment unit is further configured to assign the each pattern data of each figure pattern to be arranged in the each of the plurality of small regions concerned such that writing order is sorted per group of the plurality of groups based on a dose density that would result when writing the each figure pattern.

* * * * *